US010014240B1

(12) United States Patent
Huemoeller et al.

(10) Patent No.: US 10,014,240 B1
(45) Date of Patent: Jul. 3, 2018

(54) EMBEDDED COMPONENT PACKAGE AND FABRICATION METHOD

(71) Applicant: Amkor Technology, Inc., Tempe, AZ (US)

(72) Inventors: Ronald Patrick Huemoeller, Gilbert, AZ (US); Michael Kelly, Queen Creek, AZ (US); David Jon Hiner, Chandler, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/846,543

(22) Filed: Sep. 4, 2015

Related U.S. Application Data

(63) Continuation of application No. 13/434,181, filed on Mar. 29, 2012, now Pat. No. 9,129,943.

(51) Int. Cl.
*H01L 23/48* (2006.01)
*H01L 23/52* (2006.01)
(Continued)

(52) U.S. Cl.
CPC ...... *H01L 23/481* (2013.01); *H01L 21/76898* (2013.01); *H01L 24/05* (2013.01)

(58) Field of Classification Search
CPC ............... H01L 23/481; H01L 25/0657; H01L 21/76898
(Continued)

(56) References Cited

U.S. PATENT DOCUMENTS

| 2,596,993 A | 5/1952 | Gookin |
| 3,435,815 A * | 4/1969 | Forcier ................. B28D 5/045 |
| | | 125/16.01 |

(Continued)

FOREIGN PATENT DOCUMENTS

| DE | 19734794 | 7/1998 |
| EP | 0393997 | 10/1990 |

(Continued)

OTHER PUBLICATIONS

Kim et al., "Application of Through Mold Via (TMV) as PoP base package", 58th ECTC Proceedings, May 2008, Lake Buena Vista, FL, 6 pages, IEEE.

(Continued)

*Primary Examiner* — Fernando L Toledo
*Assistant Examiner* — Aaron Gray
(74) *Attorney, Agent, or Firm* — McAndrews, Held & Malloy, Ltd.

(57) ABSTRACT

An array includes a substrate having a frontside surface and a backside surface. A backside cavity is formed in the backside surface. Backside through vias extend through the substrate from the frontside surface to the backside surface. Embedded component through vias extend through the substrate from the frontside surface to the backside cavity. An embedded component is mounted within the backside cavity and coupled to the embedded component through vias. In this manner, the embedded component is embedded within the substrate. By embedding the embedded component within the substrate, the overall thickness of the array is minimized. Further, by electrically connecting the embedded component to the embedded component through vias, which are relatively short, the impedance between active surface ends of the embedded component through vias and the bond pads of the embedded component is minimized (Continued)

thus providing superior power management. Further, routing space on the frontside surface and/or the backside surface is preserved.

7 Claims, 6 Drawing Sheets

(51) Int. Cl.
*H01L 29/40* (2006.01)
*H01L 23/04* (2006.01)
*H01L 21/44* (2006.01)
*H01L 23/00* (2006.01)
*H01L 21/768* (2006.01)

(58) Field of Classification Search
USPC ........ 257/774, 621, 698, 773, 778, E23.011, 257/E23.067, E23.174; 438/125, 667, 438/668, 675
See application file for complete search history.

(56) References Cited

U.S. PATENT DOCUMENTS

| | | |
|---|---|---|
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,394,712 A | 7/1983 | Anthony |
| 4,417,266 A | 11/1983 | Grabbe |
| 4,451,224 A | 5/1984 | Harding |
| 4,499,655 A | 2/1985 | Anthony |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,729,061 A | 3/1988 | Brown |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,229,647 A | 7/1993 | Gnadinger |
| 5,245,751 A | 9/1993 | Locke et al. |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,268,310 A | 12/1993 | Goodrich et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,353,498 A | 10/1994 | Fillion et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,394,303 A | 2/1995 | Yamaji |
| 5,406,124 A | 4/1995 | Morita et al. |
| 5,410,180 A | 4/1995 | Fuji et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha |
| 5,432,677 A | 7/1995 | Mowatt et al. |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,576,517 A | 11/1996 | Wojnarowski et al. |
| 5,578,525 A | 11/1996 | Mizukoshi |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,264 A | 3/1997 | Gaul |
| 5,608,265 A | 3/1997 | Kitano et al. |
| 5,608,267 A | 3/1997 | Mahulikar et al. |
| 5,618,752 A * | 4/1997 | Gaul ................. H01L 21/743 257/E21.538 |
| 5,619,068 A | 4/1997 | Benzoni |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |

(56) References Cited

U.S. PATENT DOCUMENTS

| | | |
|---|---|---|
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita et al. |
| 5,736,432 A | 4/1998 | Mackessy |
| 5,736,448 A | 4/1998 | Saia et al. |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,769,989 A | 6/1998 | Hoffmeyer et al. |
| 5,770,888 A | 6/1998 | Song et al. |
| 5,776,798 A | 7/1998 | Quan et al. |
| 5,783,861 A | 7/1998 | Son |
| 5,786,238 A | 7/1998 | Pai et al. |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,841,193 A | 11/1998 | Eichelberger |
| 5,844,306 A | 12/1998 | Fujita et al. |
| 5,856,911 A | 1/1999 | Riley |
| 5,859,471 A | 1/1999 | Kuraishi et al. |
| 5,859,475 A | 1/1999 | Freyman et al. |
| 5,866,939 A | 2/1999 | Shin et al. |
| 5,871,782 A | 2/1999 | Choi |
| 5,874,770 A | 2/1999 | Saia et al. |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,937,324 A | 8/1999 | Abercrombie et al. |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,982,632 A | 11/1999 | Mosley et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,474 A | 9/2000 | Shih et al. |
| 6,114,752 A | 9/2000 | Huang et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,168,969 B1 | 1/2001 | Farnworth |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,250 B1 | 2/2001 | Melton et al. |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,214,525 B1 * | 4/2001 | Boyko ................ H01L 21/486 216/18 |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,192 B1 | 7/2001 | Natarajan |
| 6,258,629 B1 | 7/2001 | Niones et al. |
| 6,261,918 B1 | 7/2001 | So |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,255 B1 | 1/2002 | Shinq |
| 6,348,726 B1 | 2/2002 | Bayan et al. |
| 6,355,502 B1 | 3/2002 | Kang et al. |
| 6,365,974 B1 | 4/2002 | Abbott et al. |
| 6,369,447 B2 | 4/2002 | Mori |
| 6,369,454 B1 | 4/2002 | Chung |
| 6,373,127 B1 | 4/2002 | Baudouin et al. |
| 6,379,982 B1 | 4/2002 | Ahn et al. |

(56) References Cited

U.S. PATENT DOCUMENTS

| | | |
|---|---|---|
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,396,148 B1 | 5/2002 | Eichelberger et al. |
| 6,396,153 B2 | 5/2002 | Fillion et al. |
| 6,400,004 B1 | 6/2002 | Fan et al. |
| 6,406,934 B1 | 6/2002 | Glenn et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,429,509 B1 | 8/2002 | Hsuan |
| 6,437,429 B1 | 8/2002 | Su et al. |
| 6,444,499 B1 | 9/2002 | Swiss et al. |
| 6,448,633 B1 | 9/2002 | Yee et al. |
| 6,448,661 B1 | 9/2002 | Kim et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,476,469 B2 | 11/2002 | Hung et al. |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,521,530 B2 | 2/2003 | Peters et al. |
| 6,524,885 B2 | 2/2003 | Pierce |
| 6,534,849 B1 | 3/2003 | Gang |
| 6,545,332 B2 | 4/2003 | Huang |
| 6,545,345 B1 | 4/2003 | Glenn et al. |
| 6,559,525 B2 | 5/2003 | Huang |
| 6,566,168 B2 | 5/2003 | Gang |
| 6,573,461 B2 | 6/2003 | Roeters et al. |
| 6,577,013 B1 | 6/2003 | Glenn et al. |
| 6,583,503 B2 | 6/2003 | Akram et al. |
| 6,593,645 B2 | 7/2003 | Shih et al. |
| 6,603,196 B2 | 8/2003 | Lee et al. |
| 6,608,371 B2 | 8/2003 | Kurashima et al. |
| 6,624,005 B1 | 9/2003 | DiCaprio et al. |
| 6,667,546 B2 | 12/2003 | Huang et al. |
| 6,671,398 B2 | 12/2003 | Reinhorn et al. |
| 6,727,576 B2 | 4/2004 | Hedler et al. |
| 6,730,857 B2 | 5/2004 | Konrad et al. |
| 6,740,964 B2 | 5/2004 | Sasaki |
| 6,780,770 B2 | 8/2004 | Larson |
| 6,831,371 B1 | 12/2004 | Huemoeller et al. |
| 6,838,776 B2 | 1/2005 | Leal et al. |
| 6,845,554 B2 | 1/2005 | Frankowsky et al. |
| 6,853,572 B1 | 2/2005 | Sabharwal |
| 6,873,054 B2 | 3/2005 | Miyazawa et al. |
| 6,905,914 B1 | 6/2005 | Huemoeller et al. |
| 6,919,514 B2 | 7/2005 | Konrad et al. |
| 6,921,975 B2 | 7/2005 | Leal et al. |
| 6,930,256 B1 | 8/2005 | Huemoeller et al. |
| 7,015,075 B2 | 3/2006 | Fay et al. |
| 7,022,609 B2 | 4/2006 | Yamamoto et al. |
| 7,041,534 B2 | 5/2006 | Chao et al. |
| 7,129,158 B2 | 10/2006 | Nakai |
| 7,151,009 B2 | 12/2006 | Kim et al. |
| 7,190,062 B1 | 3/2007 | Sheridan et al. |
| 7,192,807 B1 | 3/2007 | Huemoeller et al. |
| 7,208,838 B2 | 4/2007 | Masuda |
| 7,223,634 B2 | 5/2007 | Yamaguchi |
| 7,242,081 B1 | 7/2007 | Lee |
| 7,247,523 B1 | 7/2007 | Huemoeller et al. |
| 7,272,444 B2 | 9/2007 | Peterson et al. |
| 7,345,361 B2 | 3/2008 | Mallik et al. |
| 7,361,533 B1 | 4/2008 | Huemoeller et al. |
| 7,372,151 B1 | 5/2008 | Fan et al. |
| 7,420,272 B1 | 9/2008 | Huemoeller et al. |
| 7,518,229 B2 | 4/2009 | Cotte et al. |
| 7,572,681 B1 | 8/2009 | Huemoeller et al. |
| 7,632,753 B1 | 12/2009 | Rush et al. |
| 7,692,286 B1 | 4/2010 | Huemoeller et al. |
| 7,714,431 B1 | 5/2010 | Huemoeller et al. |
| 7,723,210 B2 | 5/2010 | Berry et al. |
| 7,777,351 B1 | 8/2010 | Berry et al. |
| 7,842,541 B1* | 11/2010 | Rusli ............... H01L 23/49833 438/106 |
| 7,843,052 B1 | 11/2010 | Yoo et al. |
| 7,843,072 B1 | 11/2010 | Park et al. |
| 7,902,660 B1 | 3/2011 | Lee et al. |
| 7,932,595 B1 | 4/2011 | Huemoeller et al. |
| 7,977,163 B1 | 7/2011 | Huemoeller et al. |
| 8,039,385 B1* | 10/2011 | West ................ H01L 23/481 257/E23.033 |
| 8,188,584 B1 | 5/2012 | Berry et al. |
| 8,324,511 B1 | 12/2012 | Huemoeller et al. |
| 8,390,130 B1 | 3/2013 | Hiner et al. |
| 8,440,554 B1 | 5/2013 | Hiner et al. |
| 8,487,445 B1 | 7/2013 | Do et al. |
| 9,129,943 B1 | 9/2015 | Huemoeller et al. |
| 2001/0008305 A1 | 7/2001 | McLellan et al. |
| 2001/0011654 A1 | 8/2001 | Schmidt et al. |
| 2001/0012704 A1 | 8/2001 | Eldridge |
| 2001/0014538 A1 | 8/2001 | Kwan et al. |
| 2002/0017710 A1 | 2/2002 | Kurashima et al. |
| 2002/0024122 A1 | 2/2002 | Jung et al. |
| 2002/0027297 A1 | 3/2002 | Ikenaga et al. |
| 2002/0030245 A1 | 3/2002 | Hanaoka et al. |
| 2002/0061642 A1 | 5/2002 | Haji et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0013232 A1 | 1/2003 | Towle et al. |
| 2003/0030131 A1 | 2/2003 | Lee et al. |
| 2003/0038344 A1 | 2/2003 | Palmer et al. |
| 2003/0047798 A1* | 3/2003 | Halahan ............... H01L 23/13 257/685 |
| 2003/0064548 A1 | 4/2003 | Isaak |
| 2003/0073265 A1 | 4/2003 | Hu et al. |
| 2003/0134455 A1 | 7/2003 | Cheng et al. |
| 2003/0207566 A1 | 11/2003 | Forbes et al. |
| 2004/0004293 A1 | 1/2004 | Murayama |
| 2004/0026781 A1 | 2/2004 | Nakai |
| 2004/0046244 A1 | 3/2004 | Nakamura et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0113260 A1 | 6/2004 | Sunohara et al. |
| 2004/0184219 A1 | 9/2004 | Otsuka et al. |
| 2004/0192033 A1 | 9/2004 | Hara |
| 2004/0251554 A1 | 12/2004 | Masuda |
| 2005/0029630 A1 | 2/2005 | Matsuo |
| 2005/0046002 A1 | 3/2005 | Lee et al. |
| 2005/0104181 A1 | 5/2005 | Lee et al. |
| 2005/0242425 A1 | 11/2005 | Leal et al. |
| 2005/0263869 A1 | 12/2005 | Tanaka et al. |
| 2005/0282314 A1 | 12/2005 | Lo et al. |
| 2007/0007639 A1 | 1/2007 | Fukazawa |
| 2007/0007641 A1 | 1/2007 | Lee et al. |
| 2007/0273049 A1 | 11/2007 | Khan et al. |
| 2007/0290376 A1 | 12/2007 | Zhao et al. |
| 2008/0116566 A1* | 5/2008 | Murayama ........... B81C 1/00301 257/700 |
| 2008/0230887 A1 | 9/2008 | Sun et al. |
| 2008/0277799 A1 | 11/2008 | Benson et al. |
| 2009/0020865 A1 | 1/2009 | Su |
| 2009/0039527 A1 | 2/2009 | Chan et al. |
| 2009/0278245 A1* | 11/2009 | Bonifield ............. H01L 23/481 257/676 |
| 2009/0283914 A1 | 11/2009 | Murayama |
| 2010/0008058 A1 | 1/2010 | Saen et al. |
| 2010/0032809 A1 | 2/2010 | Collins et al. |
| 2010/0144118 A1* | 6/2010 | Yang ............... H01L 21/76898 438/459 |
| 2011/0068444 A1 | 3/2011 | Chi et al. |
| 2011/0133333 A1* | 6/2011 | Kwon ............. H01L 21/76898 257/737 |

(56) References Cited

U.S. PATENT DOCUMENTS

| | | | |
|---|---|---|---|
| 2012/0018868 A1 | 1/2012 | Oganesian et al. | |
| 2012/0104623 A1 | 5/2012 | Pagaila et al. | |
| 2013/0056862 A1* | 3/2013 | Kim | H01L 25/0657 257/692 |

FOREIGN PATENT DOCUMENTS

| | | |
|---|---|---|
| EP | 0459493 | 12/1991 |
| EP | 0720225 | 7/1996 |
| EP | 0720234 | 7/1996 |
| EP | 0794572 | 9/1997 |
| EP | 0844665 | 5/1998 |
| EP | 0936671 | 8/1999 |
| EP | 0989608 | 3/2000 |
| EP | 1032037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |
| JP | 63-205935 | 8/1988 |
| JP | 63-233555 | 9/1988 |
| JP | 63-249345 | 10/1988 |
| JP | 63-289951 | 11/1988 |
| JP | 63-316470 | 12/1988 |
| JP | 64-054749 | 3/1989 |
| JP | 01-106456 | 4/1989 |
| JP | 01-175250 | 7/1989 |
| JP | 01-205544 | 8/1989 |
| JP | 01-251747 | 10/1989 |
| JP | 02-129948 | 5/1990 |
| JP | 03-069248 | 7/1991 |
| JP | 03-177060 | 8/1991 |
| JP | 04-098864 | 3/1992 |
| JP | 05-129473 | 5/1993 |
| JP | 05-166992 | 7/1993 |
| JP | 05-283460 | 10/1993 |
| JP | 06-092076 | 4/1994 |
| JP | 06-140563 | 5/1994 |
| JP | 06-260532 | 9/1994 |
| JP | 07-297344 | 11/1995 |
| JP | 07-312405 | 11/1995 |
| JP | 08-064634 | 3/1996 |
| JP | 08-083877 | 3/1996 |
| JP | 08-125066 | 5/1996 |
| JP | 08-222682 | 8/1996 |
| JP | 08-306853 | 11/1996 |
| JP | 09-008205 | 1/1997 |
| JP | 09-008206 | 1/1997 |
| JP | 09-008207 | 1/1997 |
| JP | 09-092775 | 4/1997 |
| JP | 09-293822 | 11/1997 |
| JP | 10-022447 | 1/1998 |
| JP | 10-163401 | 6/1998 |
| JP | 10-199934 | 7/1998 |
| JP | 10-256240 | 9/1998 |
| JP | 2000-150765 | 5/2000 |
| JP | 2000-556398 | 10/2000 |
| JP | 2001-060648 | 3/2001 |
| JP | 2002-043497 | 2/2002 |
| KR | 1994-0001979 | 1/1994 |
| KR | 10-0220154 | 6/1999 |
| KR | 2002-0049944 | 6/2002 |
| WO | 99/56316 | 11/1999 |
| WO | 99/67821 | 12/1999 |

OTHER PUBLICATIONS

Scanlan, "Package-on-package (PoP) with Through-mold Vias", Advanced Packaging, Jan. 2008, 3 pages, vol. 17, Issue 1, PennWell Corporation.

Huemoeller et al., "Integrated Circuit Film Substrate Having Embedded Conductive Patterns and Vias", U.S. Appl. No. 10/261,868, filed Oct. 1, 2002.

Berry et ai., "Direct-write Wafer Level Chip Scale Package", U.S. Appl. No. 11/289,826, filed Nov. 29, 2005.

* cited by examiner

EMBEDDED COMPONENT PACKAGE AND FABRICATION METHOD

The present application is a CONTINUATION of U.S. patent application Ser. No. 13/434,181, filed Mar. 29, 2012, entitled "EMBEDDED PASSIVE DEVICE STRUCTURE AND METHOD," the entire contents of which are hereby incorporated herein by reference, in their entirety.

TECHNICAL FIELD

The present application relates to the field of electronics, and more particularly, to methods of forming electronic component packages and related structures.

BACKGROUND

Passive components, e.g., capacitors, resistor, and inductors, are incorporated into electronic component packages. For example, a passive component is mounted to a surface of an interposer of an electronic component package using surface mount technology (SMT). However, the passive component protrudes from the surface of the interposer thus increasing the size of the overall electronic component package.

BRIEF DESCRIPTION OF THE DRAWINGS

In the following description, the same or similar elements are labeled with the same or similar reference numbers.

DETAILED DESCRIPTION

Figure 6:
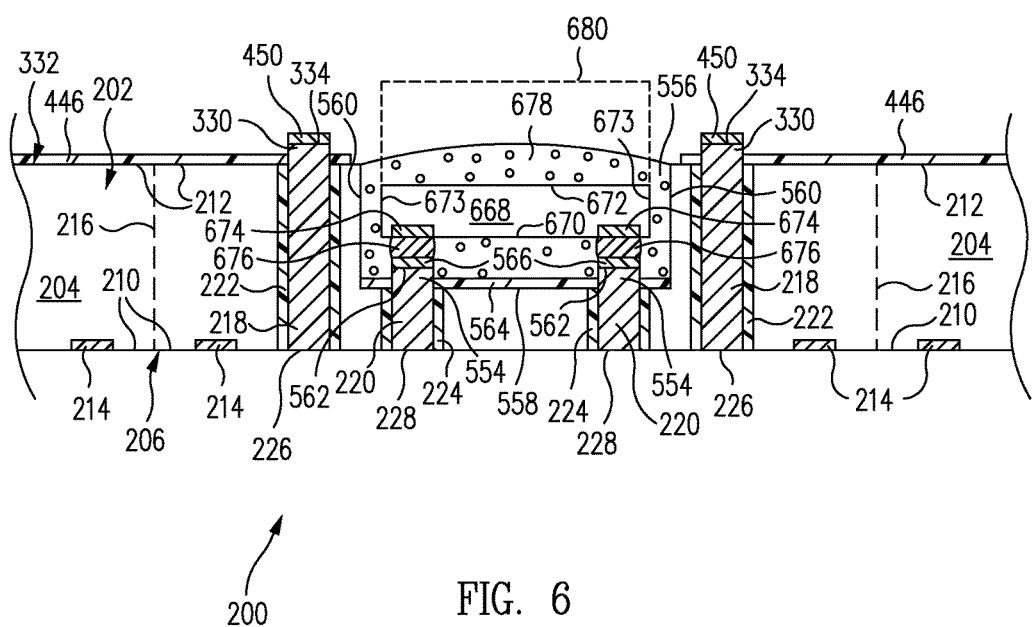

As an overview and in accordance with one embodiment, referring to FIG. 6, an array 200 includes a substrate 202 having a frontside surface 206 and a backside surface 332. A backside cavity 556 is formed in backside surface 332.

Backside through vias 218 extend through substrate 202 from frontside surface 206 to backside surface 332. Embedded component through vias 220 extend through substrate 202 from frontside surface 206 to backside cavity 556.

An embedded component 668 is mounted within backside cavity 556 and coupled to embedded component through vias 220. In this manner, embedded component 668 is embedded within substrate 202.

By embedding embedded component 668 within substrate 202, the overall thickness of array 200 is minimized. Further, by electrically connecting embedded component 668 to embedded component through vias 220, which are relatively short, the impedance between active surface ends 228 of embedded component through vias 220 and bond pads 674 of embedded component 668 is minimized thus providing superior power management. Further, routing space on frontside surface 206 and/or backside surface 332 is preserved.

Figure 1:
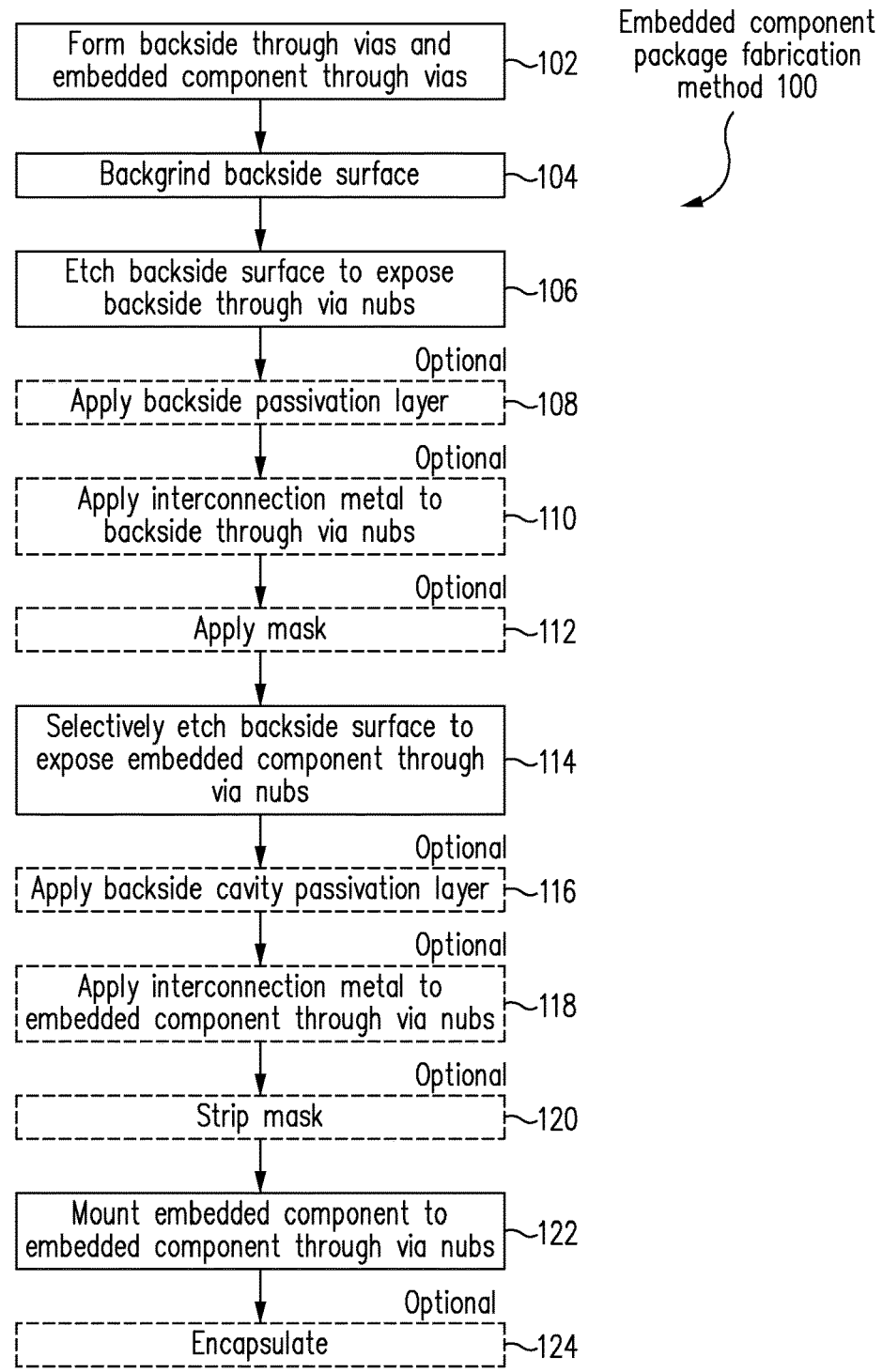
FIG. 1 is a block diagram of an embedded component package fabrication method in accordance with one embodiment.
Figure 2:
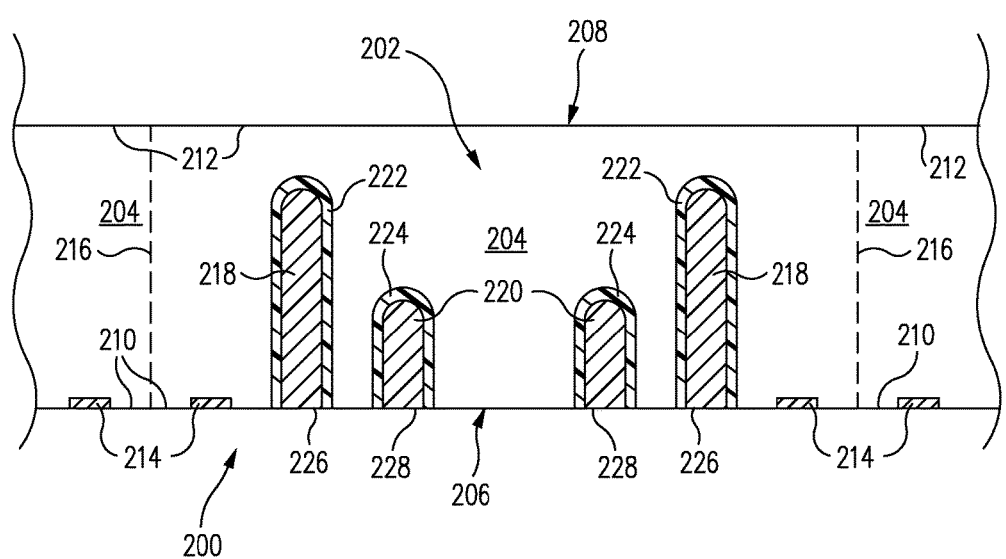
FIG. 2 is a cross-sectional view of an array including a substrate including a plurality of electronic components in accordance with one embodiment.

Now in more detail, FIG. 1 is a block diagram of an embedded component package fabrication method 100 in accordance with one embodiment. FIG. 2 is a cross-sectional view of an array 200 including a substrate 202 including a plurality of electronic components 204 in accordance with one embodiment.

In one embodiment, substrate 202 is a silicon wafer. Substrate 202 includes a frontside, e.g., first, surface 206 and an opposite backside, e.g., second, surface 208.

Substrate 202 includes electronic components 204 integrally connected to one another. For simplicity, the term substrate 202 shall be used herein and it is to be understood that this term generally includes electronic components 204.

In one embodiment, electronic components 204 are integrated circuit chips, e.g., active components including active circuitry. However, in other embodiments, electronic components 204 are passive components such as capacitors, resistors, or inductors.

In accordance with this embodiment, electronic components 204 include active surfaces 210 and opposite inactive surfaces 212. Active surfaces 210 and inactive surfaces 212 generally define frontside surface 206 and backside surface 208 of substrate 202, respectively. For simplicity, the terms frontside surface 206 and backside surface 208 shall be used herein and it is to be understood that these terms generally include active surfaces 210 and inactive surfaces 212, respectively. Electronic components 204 further includes bond pads 214 on active surfaces 210.

Electronic components 204 are delineated from one another by singulation streets 216. Substrate 202 is singulated, e.g., sawed, along singulation streets 216 to separate packaged electronic components 204 from one another at a later stage during fabrication.

In another embodiment, array 200 includes a plurality of interposers 204 connected together (instead of electronic components 204). More particularly, interposers 204, e.g., silicon interposers, have an absence of active circuitry and thus do not have bond pads 214. The structure of array 200 when formed of interposers 204 is otherwise the same or similar to the structure of array 200 when formed of electronic components as discussed above. Array 200 including electronic components 204 (instead of interposers) shall be discussed below but it is to be understood that the discussion is equally applicable to the embodiment where array 200 is formed of interposers.

Referring now to FIGS. 1 and 2 together, in a form backside through vias and embedded component through vias operation 102, backside through vias 218 and embedded component through vias 220 are formed in electronic components 204. Backside through vias 218 and embedded component through vias 220 are surrounded by dielectric backside through via passivation linings 222 and dielectric embedded component through via passivation linings 224, respectively.

Illustratively, backside through vias 218 are formed first and then embedded component through vias 220 are formed second. In accordance with this embodiment, a first set of through via apertures are formed, e.g., by laser drilling, into electronic components 204 from frontside surface 206. Backside through via passivation linings 222, e.g., silicon oxide ($SiO_2$), are formed on the sidewalls of the first set of through via apertures. In one embodiment, the silicon of substrate 202 exposed within the first set of through via apertures is oxidized to form backside through via passivation linings 222. In another embodiment, a dielectric material is deposited within the first set of through via apertures to form backside through via passivation linings 222.

Backside through vias 218 are formed within backside through via passivation linings 222. Illustratively, an electrically conductive material, e.g., copper or tungsten, is deposited, e.g., plated, within backside through via passivation linings 222 to form backside through vias 218. Backside through via passivation linings 222 electrically isolate backside through vias 218 from substrate 202.

A patterned mask is then applied to cover and protect backside through vias 218 and backside through via passivation linings 222 at frontside surface 206 of substrate 202. Embedded component through vias 220 and embedded component through via passivation linings 224 are then formed.

More particularly, a second set of through via apertures are formed, e.g., by laser drilling, into electronic components 204 from frontside surface 206. Embedded component through via passivation linings 224, e.g., silicon oxide ($SiO_2$), are formed on the sidewalls of the second set of through via apertures in a manner similar to that discussed above regarding the formation of backside through via passivation linings 222.

Embedded component through vias 220 are formed within embedded component through via passivation linings 224 in a manner similar to discussed above regarding the formation of backside through vias 218. Embedded component through via passivation linings 224 electrically isolate embedded component through vias 220 from substrate 202. The patterned mask is then stripped.

Although formation of backside through vias 218 and backside through via passivation linings 222 prior to the formation of embedded component through vias 220 and embedded component through via passivation linings 224 is described above, in other embodiments, embedded component through vias 220 and embedded component through via passivation linings 224 are formed prior to, or simultaneously with, backside through vias 218 and backside through via passivation linings 222.

Backside through vias 218 are longer than embedded component through vias 220 in this embodiment. More particularly, backside through vias 218 have a length L1, e.g., 100 μm, and embedded component through vias 220 have a length L2, e.g., 15 μm, where length L1 is greater than length L2.

Backside through vias 218 and embedded component through vias 220 include active surface ends 226, 228, respectively. Active surface ends 226, 228 are circular in accordance with this embodiment. Active surface ends 226, 228 are coplanar with and parallel to frontside surface 206 of substrate 202.

In one embodiment, a frontside circuit pattern including one or more dielectric layers is formed on frontside surface 206. The frontside circuit pattern is electrically coupled to active surface ends 226, 228 and/or bond pads 214.

From form backside through vias and embedded component through vias operation 102, flow moves to a backgrind backside surface operation 104. In backgrind backside surface operation 104, substrate 202 is thinned, sometimes called backgrinded, to almost expose backside through vias 218 at backside surface 208 of substrate 202. More particularly, backside through vias 218 and embedded component through vias 220 remain enclosed within substrate 202 at backside surface 208 in accordance with this embodiment.

As illustrated, except at frontside surface 206, backside through vias 218 and embedded component through vias 220 are totally enclosed within linings 222, 224. Further, a portion of substrate 202, e.g., silicon, remains between backside through vias 218 and backside surface 208 and also between embedded component through vias 220 and backside surface 208. However, in another embodiment, substrate 202 is thinned to expose backside through vias 218 at backside surface 208 of substrate 202.

Figure 3:
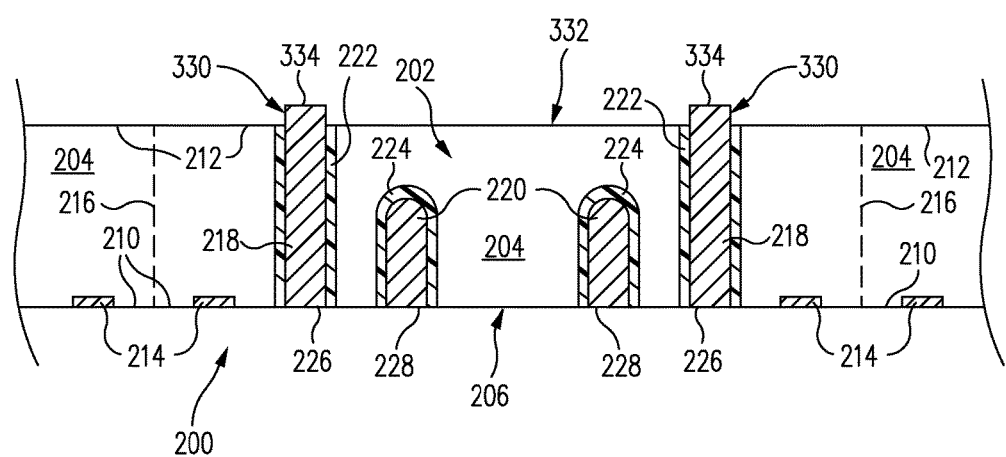
FIGS. 3, 4, 5, 6 are cross-sectional views of the array of FIG. 2 at later stages during fabrication in accordance with various embodiments.

FIG. 3 is a cross-sectional view of array 200 of FIG. 2 at a later stage during fabrication in accordance with one embodiment. Referring now to FIGS. 1, 2, and 3 together, from backgrind backside surface operation 104, flow moves to an etch backside surface to expose backside through via nubs operation 106. In etch backside surface to expose backside through via nubs operation 106, backside surface 208 of substrate 202 is etched, i.e., removed, to expose backside through via nubs 330 of backside through vias 218. Etch backside surface to expose backside through via nubs operation 106 is sometimes called a primary reveal operation.

In one embodiment, backside surface 208 is removed using a selective etch that etches substrate 202, e.g., silicon, but does not etch backside through vias 218, e.g., copper. Optionally, the portion of backside through via passivation lining 222 covering backside through via nubs 330 is also removed.

Generally, substrate 202 is thinned from backside surface 208. Stated another way, a portion of substrate 202 at backside surface 208 as illustrated in FIG. 2 is removed to form a recessed backside surface 332 as illustrated in FIG. 3. For example, a Si dry or wet etch is performed to thin substrate 202.

Accordingly, after performance of etch backside surface to expose backside through via nubs operation 106, substrate 202 includes a recessed backside surface 332. Inactive surfaces 212 generally define recessed backside surface 332. For simplicity, the term recessed backside surface 332 shall be used herein and it is to be understood that this term generally includes inactive surfaces 212.

However, backside through vias 218 are not thinned and thus backside through via nubs 330 are exposed as illustrated in FIG. 3. Backside through vias 218 are sometimes said to stand proud of or extend from recessed backside surface 332.

Backside through via nubs 330 are the upper portions of backside through vias 218 exposed and uncovered by substrate 202. Backside through via nubs 330 are cylindrical protrusions protruding upwards from recessed backside surface 332.

Backside through via nubs 330, e.g., first portions of backside through vias 218, include inactive surface ends 334, e.g., planar circular ends or curved ends. Inactive surface ends 334 are spaced above recessed backside surface 332. Generally, backside through vias 218 are electrically conductive columns extending between active surface ends 226 and inactive surface ends 334.

Figure 4:
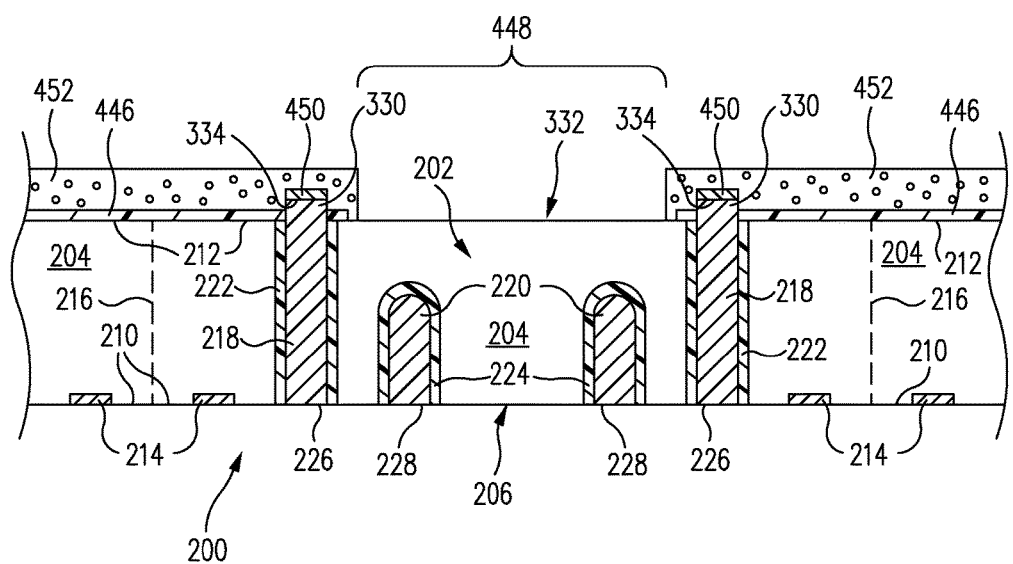

FIG. 4 is a cross-sectional view of array 200 of FIG. 3 at a later stage during fabrication in accordance with one embodiment. Referring now to FIGS. 1 and 4 together, from etch backside surface to expose backside through via nubs operation 106, flow moves, optionally, to an apply backside passivation layer operation 108. In apply backside passivation layer operation 108, a backside passivation layer 446 is applied to recessed backside surface 332.

Backside passivation layer 446 is a dielectric material. In one embodiment, backside passivation layer 446 is formed from an organic material such as polyimide (PI), polybutyloxide (PBO), benzocyclobutene (BCB), a polymer, or other carbon containing material. In one embodiment, backside passivation layer 446 is formed by spinning, or spraying an organic material onto recessed backside surface 332 or applying a laminated film. In other embodiments, backside passivation layer 446 is an inorganic material, e.g., silicon oxide or silicon nitride, formed using a plasma enhanced chemical vapor deposition (PECVD) deposition process.

Backside passivation layer 446 is patterned to expose inactive surface ends 334 of backside through vias 218. In accordance with this embodiment, backside passivation layer 446 is further patterned to expose an embedded component cavity region 448 of recessed backside surface 332.

Embedded component cavity region 448 is the region of recessed backside surface 332 where a backside cavity will be formed as discussed below. Generally, embedded component cavity region 448 is above embedded component through vias 220 such that etching embedded component cavity region 448 will expose embedded component through vias 220 as discussed below. Illustratively, embedded component cavity region 448 is a 1 mm square area.

However, in another embodiment, backside passivation layer 446 covers embedded component cavity region 448.

From apply backside passivation layer operation 108, flow moves, optionally, to an apply interconnection metal to backside through via nubs operation 110. In apply interconnection metal to backside through via nubs operation 110, an interconnection metal 450 is applied to inactive surface ends 334 of backside through vias 218. Interconnection metal 450 is an electrically conductive material, e.g., a gold and/or nickel layer, that enhances bonding with backside through vias 218.

From apply interconnection metal to backside through via nubs operation 110, flow moves, optionally, to an apply mask operation 112. In apply mask operation 112, a patterned mask 452 is applied generally to recessed backside surface 332.

More particularly, patterned mask 452 is applied to and protects backside passivation layer 446 and inactive surface ends 334 including interconnection metal 450 formed thereon. Patterned mask 452 exposes embedded component cavity region 448.

Figure 5:
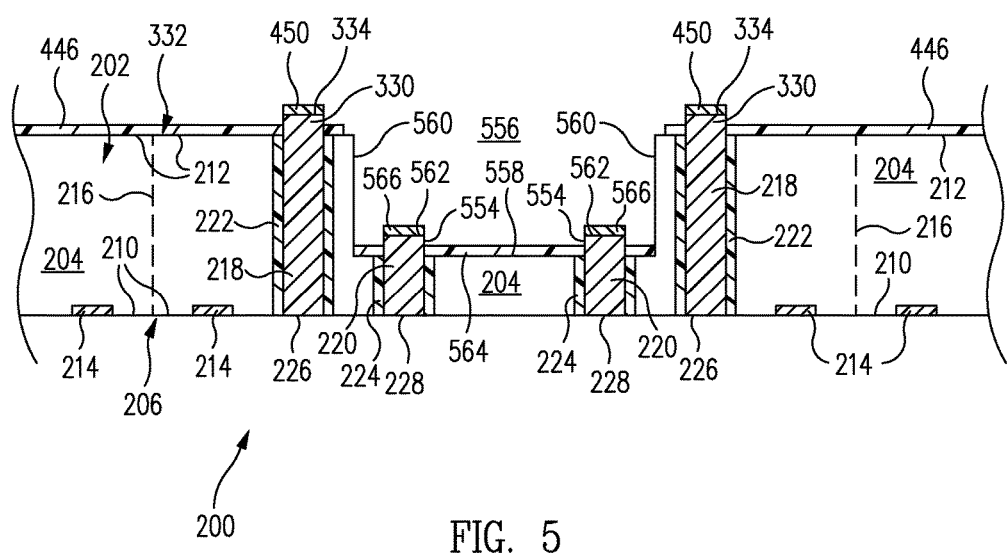

FIG. 5 is a cross-sectional view of array 200 of FIG. 4 at a later stage during fabrication in accordance with one embodiment. Referring now to FIGS. 1, 4, and 5 together, from apply mask operation 112, flow moves to a selectively etch backside surface to expose embedded component through via nubs operation 114. In selectively etch backside surface to expose embedded component through via nubs operation 114, recessed backside surface 332 is selectively etched, i.e., selectively removed, to expose embedded component through via nubs 554. Selectively etch backside surface to expose embedded component through via nubs operation 114 is sometimes called a secondary reveal operation.

More particularly, embedded component cavity region 448 is etched using patterned mask 452 to prevent etching of the remaining area of recessed backside surface 332. In one embodiment, embedded component cavity region 448 is removed using a selective etch that etches substrate 202, e.g., silicon, but does not etch embedded component through vias 220, e.g., copper.

For example, once embedded component through vias 220 are revealed, an additional 5 μm of substrate 202 is removed to expose embedded component through via nubs 554. Optionally, the portion of embedded component through via passivation linings 224 covering embedded component through via nubs 554 is also removed.

By etching embedded component cavity region 448, a backside cavity 556 is formed in recessed backside surface 332. Backside cavity 556 is defined by a backside cavity base 558 and backside cavity sidewalls 560.

Backside cavity base 558 is parallel to frontside surface 206 and recessed backside surface 332 and located therebetween. Backside cavity sidewalls 560 extend perpendicularly between backside cavity base 558 and recessed backside surface 332. Although various features herein may be described as parallel, perpendicular, and having other orientations, in light of this disclosure, those of skill in the art will understand that the features may not be exactly parallel or perpendicular, but only substantially parallel and perpendicular to within accepted manufacturing tolerances.

Embedded component through vias 220 are not thinned and thus embedded component through via nubs 554 are exposed from backside cavity base 558 as illustrated in FIG. 5. Embedded component through vias 220 are sometimes said to stand proud of or extend from backside cavity base 558.

Embedded component through via nubs 554 are the upper portions of embedded component through vias 220 exposed and uncovered by substrate 202. Embedded component through via nubs 554 are cylindrical protrusions protruding upwards from backside cavity base 558 and into backside cavity 556.

Embedded component through via nubs 554, e.g., first portions of embedded component through vias 220, include inactive surface ends 562, e.g., planar circular ends or curved ends. Inactive surface ends 562 are spaced above backside cavity base 558. Generally, embedded component through vias 220 are electrically conductive columns extending between active surface ends 228 and inactive surface ends 562.

From selectively etch backside surface to expose embedded component through via nubs operation 114, flow moves, optionally, to an apply backside cavity passivation layer operation 116. In apply backside cavity passivation layer operation 116, a backside cavity passivation layer 564 is applied to backside cavity base 558. Optionally, backside cavity passivation layer 564 is also applied to backside cavity sidewalls 560.

Backside cavity passivation layer 564 is a dielectric material similar to backside passivation layer 446 as described above, and is applied in a similar manner. Backside cavity passivation layer 564 is patterned to expose inactive surface ends 562 of embedded component through vias 220.

From apply backside cavity passivation layer operation 116, flow moves, optionally, to an apply interconnection metal to embedded component through via nubs operation 118. In apply interconnection metal to embedded component through via nubs operation 120, an interconnection metal 566 is applied to inactive surface ends 562 of embedded component through vias 220. Interconnection metal 566 is an electrically conductive material, e.g., a gold and/or nickel layer, that enhances bonding with embedded component through vias 220.

From apply interconnection metal to embedded component through via nubs operation 120, flow moves, optionally, to a strip mask operation 120. In strip mask operation 120, patterned mask 452 is stripped, i.e., removed, resulting in array 200 as illustrated in FIG. 5.

FIG. 6 is a cross-sectional view of array 200 of FIG. 5 at a later stage during fabrication in accordance with one embodiment. Referring now to FIGS. 1 and 6 together, from strip mask operation 120, flow moved to a mount embedded component to embedded component through via nubs operation 122. In mount embedded component to embedded component through via nubs operation 122, an embedded component 668 is mounted, e.g., physically and electrically connected, to embedded component through via nubs 554. Embedded component 668 is an electronic component, e.g., is an off the shelf passive component such as a capacitor, resistor, or inductor. In another embodiment, embedded component 668 is an integrated circuit chip, e.g., an active component including active circuitry.

In accordance with this embodiment, embedded component 668 includes an active surface 670, an opposite inactive surface 672, and sides 673 extending therebetween. Active surface 670 further includes bond pads 674 thereon. Bond pads 674 are sometimes called terminals.

Bond pads 674 are physically and electrically connected to inactive surface ends 562, e.g., interconnection metal 566 thereon, by bumps 676, e.g., flip chip solder bumps or SMT joints.

As illustrated in FIG. 6, embedded component 668 is mounted within backside cavity 556. Accordingly, embedded component 556 is embedded within substrate 202. In one embodiment, inactive surface 672 is recessed below recessed backside surface 332 such that embedded component 668 is located entirely within backside cavity 556.

By embedding embedded component 668 within substrate 202, the overall thickness of array 200 is minimized. Further, by electrically connecting embedded component 668 to embedded component through vias 220, which are relatively short, the impedance between active surface ends 228 and bond pads 674 is minimized thus providing superior power management. Further, routing space on frontside surface 206 and/or recessed backside surface 332 is preserved.

From mount embedded component to embedded component through via nubs operation 122, flow moves, optionally, to an encapsulate operation 124. In encapsulate operation 124, embedded component 668 is encapsulated in a dielectric package body 678. Package body 678 fills the space between active surface 670 and backside cavity base 558 and enclosed bumps 676. In one embodiment, package body 678 is an underfill such that some or all of sides 673 of embedded component 668 are exposed.

In another embodiment such as the one illustrated, package body 678, e.g., a glob top encapsulant, completely encloses embedded component 668 including sides 673 and inactive surface 672 and fills backside cavity 556.

In another embodiment, as indicated by the dashed line 680, embedded component 668 protrudes out of backside cavity 556 to a height above recessed backside surface 332.

Array 200 is singulated along singulation streets 216 resulting in a plurality of embedded component packages or embedded component interposers depending upon the embodiment.

In other embodiments, one or more of operations 108, 110, 112, 116, 118, 120, 124 are not performed and so operations 108, 110, 112, 116, 118, 120, 124 are optional.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. An electronic device structure comprising:
 a substrate comprising:
  an integrated circuit (IC) chip;
  an active frontside surface;
  an inactive backside surface, wherein the IC chip comprises a bond pad on the frontside surface;
  a backside cavity in the backside surface, the backside cavity comprising a backside cavity base and backside cavity sidewalls; and
  an embedded component through via extending through the substrate from the frontside surface to the backside cavity;
  a backside through via extending through the substrate from the frontside surface to the backside surface;
  a backside through via nub, where the backside through via nub comprises an end portion of a first continuous metal column filling the backside through via;
  a first passivation lining isolating the first continuous metal column from the IC chip, wherein the first passivation lining does not extend from the IC chip;
  an embedded component through via nub protruding from the backside cavity base, where the embedded component through via nub comprises an end portion of a second continuous metal column filling the embedded component through via; and
  a second passivation lining isolating the second continuous metal column from the IC chip, wherein the second passivation lining does not extend from the backside cavity base;
 an encapsulant that fills at least a portion of the backside cavity, wherein the encapsulant does not extend laterally beyond the cavity sidewalls;
 a backside passivation layer that covers the backside surface of the substrate but not at least a portion of the backside cavity sidewalls, wherein the backside through via nub protrudes from the backside passivation layer.

2. The structure of claim 1, wherein the encapsulant fills the entire backside cavity and extends from the backside cavity.

3. The structure of claim 1, wherein the backside passivation layer is separated from the encapsulant.

4. The structure of claim 3, wherein the encapsulant directly contacts the backside cavity sidewalls around an entire periphery of the backside cavity.

5. The structure of claim 1, comprising an interconnection metal on a backside surface of the embedded component through via nub, wherein a lateral side of the embedded component through via nub that extends completely around the embedded component through via nub is not covered by the interconnection metal.

6. The structure of claim 1, comprising:
 an embedded electronic component in the backside cavity, the embedded electronic component comprising: a first component surface facing the backside cavity base, a second component surface opposite the first component surface, and a plurality of side component surfaces connecting the first component surface and the second component surface,
 wherein the encapsulant completely fills the backside cavity, and at least a portion of one of the plurality of side component surfaces is exposed from the encapsulant.

7. The structure of claim 1, wherein the encapsulant overfills the backside cavity and comprises a convex curved backside surface.

* * * * *